US010283462B1

(12) United States Patent
Davis et al.

(10) Patent No.: US 10,283,462 B1
(45) Date of Patent: May 7, 2019

(54) SEMICONDUCTOR DEVICES WITH POST-PROBE CONFIGURABILITY

(71) Applicant: Micron Technology, Inc., Boise, ID (US)

(72) Inventors: James E. Davis, Meridian, ID (US); Kevin G. Duesman, Boise, ID (US); Jeffrey P. Wright, Boise, ID (US); Warren L. Boyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/811,579

(22) Filed: Nov. 13, 2017

(51) Int. Cl.
*H01L 23/60* (2006.01)
*H01L 23/00* (2006.01)
*H01L 25/04* (2014.01)
*H01L 23/538* (2006.01)

(52) U.S. Cl.
CPC ............ *H01L 23/60* (2013.01); *H01L 23/538* (2013.01); *H01L 24/02* (2013.01); *H01L 24/10* (2013.01); *H01L 24/95* (2013.01); *H01L 25/043* (2013.01)

(58) Field of Classification Search
CPC ...... H01L 23/60; H01L 23/538; H01L 25/043
See application file for complete search history.

(56) References Cited

U.S. PATENT DOCUMENTS

| 2004/0140860 | A1 | 7/2004 | Miller |
| 2006/0071320 | A1 | 4/2006 | Shibata et al. |
| 2009/0321954 | A1* | 12/2009 | Oh ......................... H01L 24/24 257/777 |
| 2013/0228867 | A1* | 9/2013 | Suematsu ............... H01L 23/60 257/355 |
| 2014/0082345 | A1 | 3/2014 | Asano et al. |
| 2015/0311094 | A1 | 10/2015 | Whang et al. |
| 2017/0025402 | A1* | 1/2017 | Opoczynski ........ H01L 27/0255 |
| 2018/0076807 | A1* | 3/2018 | Devarajan ............ H03K 17/005 |
| 2018/0109251 | A1* | 4/2018 | Djelassi ........... H03K 3/356182 |
| 2018/0294251 | A1 | 10/2018 | Liu et al. |

OTHER PUBLICATIONS

Davis et al., Unpublished U.S. Appl. No. 15/811,572; entitled: "Semiconductor Devices With Package-Level Configurability", filed Nov. 13, 2017, 33 pages.
International Application No. PCT/US2018/053862—International Search Report and Written Opinion, dated Mar. 11, 2019, 12 pages.

* cited by examiner

*Primary Examiner* — Jay C Chang
*Assistant Examiner* — Mikka Liu
(74) *Attorney, Agent, or Firm* — Perkins Coie LLP

(57) ABSTRACT

A semiconductor device assembly includes a substrate and a die coupled to the substrate. The die includes a first contact pad electrically coupled to a first circuit on the die including at least one active circuit element, a second contact pad electrically coupled to a second circuit on the die including only passive circuit elements, and a plated pad electrically coupling at least a part of the first contact pad to at least a part of the second contact pad. The substrate includes a substrate contact electrically coupled to the plated pad on the die.

10 Claims, 9 Drawing Sheets

SEMICONDUCTOR DEVICES WITH POST-PROBE CONFIGURABILITY

CROSS-REFERENCE TO RELATED APPLICATIONS

This application contains subject matter related to a concurrently-filed U.S. Patent Application by James E. Davis, John B. Pusey, Zhiping Yin, and Kevin G. Duesman, entitled "SEMICONDUCTOR DEVICES WITH PACKAGE-LEVEL CONFIGURABILITY". The related application, of which the disclosure is incorporated by reference herein, is assigned to Micron Technology, Inc.

TECHNICAL FIELD

The present disclosure generally relates to semiconductor devices, and more particularly relates to semiconductor devices with post-probe configurability.

BACKGROUND

Packaged semiconductor dies, including memory chips, microprocessor chips, and imager chips, typically include one or more semiconductor dies mounted on a substrate and encased in a plastic protective covering or covered by a heat-conducting lid. The die can include active circuits (e.g., providing functional features such as memory cells, processor circuits, and/or imager devices) and/or passive features (e.g., capacitors, resistors, etc.) as well as bond pads electrically connected to the circuits. The bond pads can be electrically connected to terminals outside the protective covering to allow the die to be connected to higher level circuitry.

For example, FIG. 1 is a simplified partial cross-sectional view of a semiconductor device assembly 100 including multiple semiconductor dies 102 and 103 stacked in a shingled fashion on a substrate 101 and covered by an encapsulant 170. Each die includes one or more contact pads, such as contact pads 122 and 123 to provide connectivity to a corresponding integrated circuit, such as circuits 162 and 163. The contact pads 122 and 123 can be connected to a substrate contact 121 by wirebonds 131 and 132 (shown in a daisy-chain configuration), to provide connectivity to circuits 162 and 163 via solder ball 151 (by way of via 152).

With some semiconductor dies, various bond pads can be connected to multiple circuits in a die. For example, in a NAND memory die, a single bond pad may be connected to both an active driver circuit and a passive ESD protection circuit (e.g., including one or more capacitors). The ESD protection circuit can be designed to provide a desired amount of capacitance to protect the single active driver circuit. In a semiconductor device assembly including multiple such NAND memory dies with active driver circuits connected in parallel (e.g., with the corresponding bond pad from each NAND memory die connected to the same external terminal), the excess capacitance provided by the ESD protection circuit from each die being connected in parallel can degrade device performance. This can be addressed by designing different NAND memory dies for different package densities (e.g., a NAND memory die configured to be packaged alone, a different NAND memory die with less capacitive ESD protection circuits configured to be packaged in a stack of two, yet another NAND memory die with even less capacitive ESD protection circuits configured to be packaged in a stack of four, etc.), but designing and fabricating multiple different semiconductor dies for each possible package configuration is prohibitively expensive. Accordingly, there is a need for a semiconductor die that can be configured with different amounts of ESD protection depending upon the configuration in which the die is packaged.

DETAILED DESCRIPTION

Figure 1:
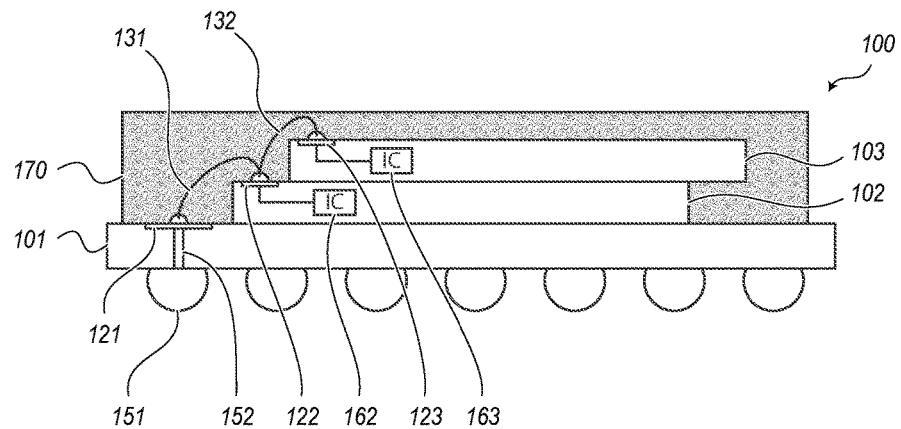
FIG. 1 is a simplified partial cross-sectional view of a semiconductor device assembly including multiple semiconductor dies stacked on a substrate.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, when semiconductor dies with an ESD protection circuit connected to the same bond pad as an active circuit (e.g., a driver circuit) are connected together in different package densities, the amount of capacitance provided by the ESD protection circuit cannot be optimized for each package density. Accordingly, several embodiments of semiconductor devices in accordance with the present technology can provide package-level configurability of a provided capacitance to overcome this challenge.

Several embodiments of the present technology are directed to semiconductor device assemblies including a substrate and a die coupled to the substrate. The die includes a first contact pad electrically coupled to a first circuit on the die including at least one active circuit element, a second contact pad electrically coupled to a second circuit on the die including only passive circuit elements, and a plated pad electrically coupling at least a part of the first contact pad to at least a part of the second contact pad. The substrate includes a substrate contact electrically coupled to the plated pad on the die. The semiconductor device assemblies can further include a second die including a third contact pad electrically coupled to a third circuit on the second die including at least a second active circuit element, and a fourth contact pad electrically coupled to a fourth circuit on the second die including only passive circuit elements. The substrate contact can be electrically coupled to the third contact pad on the second die, and can either be electrically disconnected from the fourth contact pad on the second die, or electrically coupled to the fourth contact pad on the second die by another plated pad electrically coupling at least a part of the third contact pad to at least a part of the fourth contact pad.

Specific details of several embodiments of semiconductor devices are described below. The term "semiconductor device" generally refers to a solid-state device that includes a semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

Figure 2:
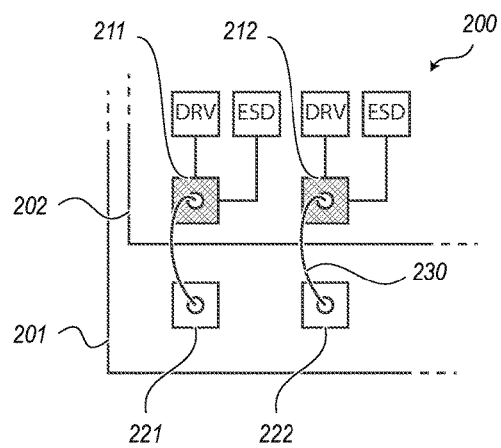
FIG. 2 is a simplified schematic view of a semiconductor device assembly.

FIG. 2 is a simplified schematic view of a semiconductor device assembly 200 including a semiconductor die 202 coupled to a substrate 201. The die includes contact pads, such as contact pads 211 and 212, which are each connected to both an integrated circuit with active components (schematically illustrated as a driver (DRV) circuit), and an integrated circuit with passive components (schematically illustrated as an electrostatic discharge (ESD) protection circuit). The contact pads 211 and 212 are electrically coupled by wirebonds 230 to substrate contacts 221 and 222. As can be seen with reference to FIG. 2, if semiconductor die 202 has been configured with an amount of capacitance suitable to provide ESD protection for a single driver circuit, then adding another such semiconductor die to the assembly 200 can undesirably increase the capacitance "seen" by the substrate contacts 221 and 222.

Figure 3:
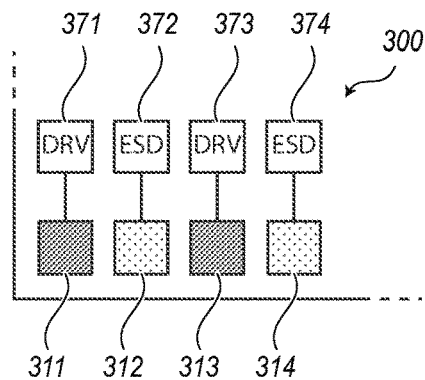
FIG. 3 is a simplified schematic view of a semiconductor device in accordance with an embodiment of the present technology.

To address this problem, embodiments of the present technology can provide a semiconductor die in which an active circuit, and the passive circuit configured to provide ESD protection thereto, are connected to separate contact pads, such that a desired amount of capacitance can be provided regardless of the number of dies provided in a package assembly. For example, FIG. 3 is a simplified schematic view of a semiconductor device 300 in accordance with an embodiment of the present technology. Semiconductor device 300 includes a plurality of contact pads, such as first through fourth contact pads 311-314, for providing connectivity to circuits in the semiconductor device 300. For example, the first contact pad 311 provides connectivity to a first circuit 371 with active components (e.g., a driver circuit), and the second contact pad 312 provides connectivity to a second circuit 372 with passive components (e.g., an ESD protection circuit). Similarly, the third contact pad 313 provides connectivity to a third circuit 373 with active components (e.g., a driver circuit), and the fourth contact pad 314 provides connectivity to a fourth circuit 374 with passive components (e.g., an ESD protection circuit). By providing each passive circuit with a dedicated contact pad, semiconductor device 300 makes possible different packaging densities utilizing multiple identical semiconductor dies, while providing a desired amount of ESD protection and without, e.g., excess capacitance causing the driver circuits 371 and 373 to consume excess power.

Figure 4:
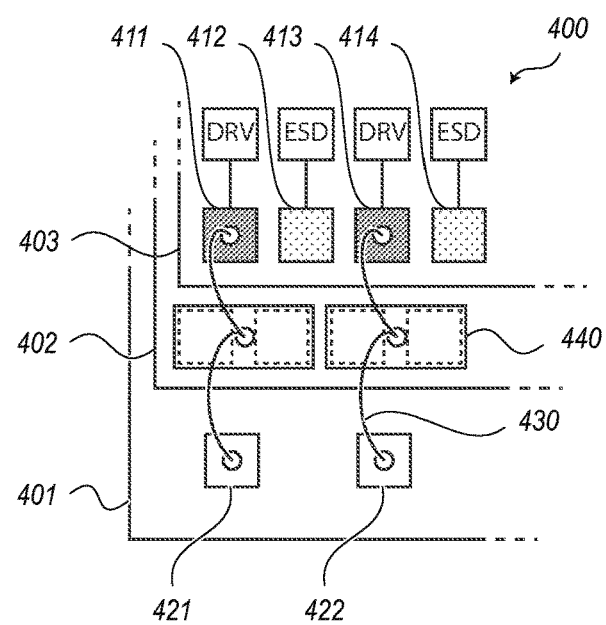
FIG. 4 is a simplified schematic view of a semiconductor device assembly in accordance with an embodiment of the present technology.

This can be better understood with reference to FIG. 4, which is a simplified schematic view of a semiconductor device assembly 400 in accordance with an embodiment of the present technology. Assembly 400 includes a substrate 401 and two semiconductor dies 402 and 403 (e.g., identical semiconductor dies). Like the semiconductor device 300 illustrated in FIG. 3 above, each semiconductor die 402 and 403 includes multiple contact pads, such as first through fourth contact pads 411-414, each providing connectivity to either a circuit with active components (e.g., a driver circuit) or a circuit with passive components (e.g., an ESD protection circuit). Because each ESD protection circuit is provided with a dedicated contact pad, the assembly 400 can be configured with a desired amount of ESD protection for each driver circuit.

As can be seen with reference to FIG. 4, the substrate 401 includes two substrate contacts 421 and 422. The first substrate contact 421 is connected (e.g., by a wirebond 430) to a plated pad 440 that connects at least a part of the first contact pad 411 (corresponding to a driver circuit) to at least a part of the second contact pad 412 (corresponding to an ESD protection circuit) of the lower semiconductor die 402. The plated pad 440 is further connected by another wirebond to only the first contact pad 411 of the upper semiconductor die 403. In this manner, the first substrate contact 421 is electrically coupled to both the first and second contact pads 411 and 412 of the lower semiconductor die 402 and to just the first contact pad 411 of the upper semiconductor die 403. Similarly, the second substrate contact 422 is connected (e.g., by a wirebond 430) to the third contact pad 413 (corresponding to a driver circuit) of each semiconductor die 402 and 403 in the assembly 400, but is connected to the fourth contact pad 414 (corresponding to an ESD protection circuit) of only one semiconductor die 402 in the assembly 400. By leaving electrically disconnected from the substrate contacts 421 and 422 the second and fourth contact pads 412 and 414 (corresponding to ESD protection circuits) on the upper semiconductor die 403 (e.g., by not connecting these pads to the corresponding driver pads 411 and 413 with a plated pad such as the plated pads 440 on the lower semiconductor die 402), the capacitance of the circuit to which each substrate contact 421 and 422 is connected is less than it would be if ESD protection circuits from each die in the assembly 400 were connected.

According to one aspect of the present disclosure, the plated pad 440 can be provided over the first and second contact pads 411 and 412 of a semiconductor die, such as lower semiconductor die 402, using wafer-level redistribution layer (RDL) fabrication techniques (e.g., before the die has been singulated from its panel or wafer). The fabrication of the plated pad can be performed after a probe operation, in which the dies on a wafer or panel have been tested and binned to determine their eventual packaging density. For example, dies that are determined in a probing operation to be capable of a higher operating speeds may be binned for a higher packaging density (e.g., dual device package (DDP), quad device package (QDP), or even higher densities), while dies that are determined in a probing operation to be capable of lower operating speeds may be binned for lower packaging density (e.g., single device package (SDP) density). Based on the determined packaging density for which the dies in a wafer are to be assembled, the plated pads can either be included (e.g., in all dies destined for SDP density, in lower dies destined for DDP or QDP densities) or omitted (in upper dies destined for DDP or QDP densities, or in all dies destined for higher packaging densities). The ability to connect the ESD circuits to the driver circuits after a probe operation allows efficient wafer-level operations to be performed on otherwise identical die designs used in multi-device packages.

Although FIG. 4 has been described and illustrated as including multiple identical semiconductor dies, in other embodiments of the present technology semiconductor device assemblies with different types of dies can be provided with similar features. For example, in one embodiment a semiconductor device assembly can include a logic die and a memory die, one or both of which can include discrete contact pads for passive circuits to be connected as desired post-probe. Moreover, although FIG. 4 has been described and illustrated as including semiconductor dies with two driver circuits, it will be readily apparent to those skilled in the art that this embodiment is but one example, and semiconductor dies with different numbers of driver circuits can also be provided. Furthermore, FIG. 4 has been described and illustrated as providing contact pads for ESD protection circuits separate from contact pads for driver circuits, in other embodiments circuits with other active elements besides drivers can be provided, and other circuits including only passive components (e.g., resistors, capacitors, inductors, etc.) can likewise be provided.

Figure 5:
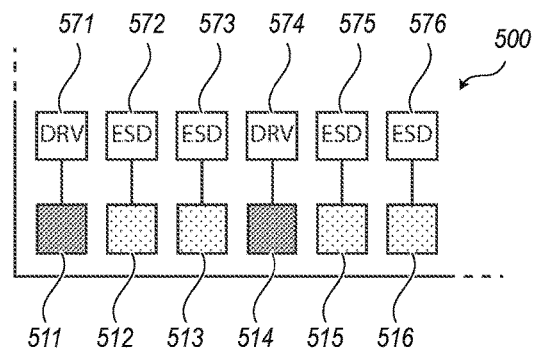
FIG. 5 is a simplified schematic view of a semiconductor device in accordance with an embodiment of the present technology.

Although in the foregoing examples semiconductor dies have been described and illustrated as including a single ESD protection circuit corresponding to each driver circuit, in other embodiments of the present technology, additional configurability can be provided by including multiple ESD protection circuits with dedicated contact pads corresponding to each driver circuit on a semiconductor die. For example, FIG. 5 is a simplified schematic view of a semiconductor device 500 in accordance with an embodiment of the present technology. Semiconductor device 500 includes a plurality of contact pads, such as first through sixth contact pads 511-516, for providing connectivity to circuits in the semiconductor device 500. For example, the first contact pad 511 provides connectivity to a first circuit 571 with active components (e.g., a driver circuit), and the second and third contact pads 512 and 513 provide connectivity to second and third circuits 572 and 573, respectively, which include only passive components (e.g., ESD protection circuits). Similarly, the fourth contact pad 514 provides connectivity to a fourth circuit 574 with active components (e.g., a driver circuit), and the fifth and sixth contact pads 515 and 516 provide connectivity to fifth and sixth circuits 575 and 576, respectively, which include only passive components (e.g., ESD protection circuits). By providing each active circuit with multiple corresponding passive circuits, each with their own dedicated contact pad, semiconductor device 500 makes possible different packaging densities utilizing multiple identical semiconductor dies, while providing a desired amount of ESD protection without, e.g., excess capacitance causing the driver circuits 571 and 574 to consume excess power.

Figure 6:
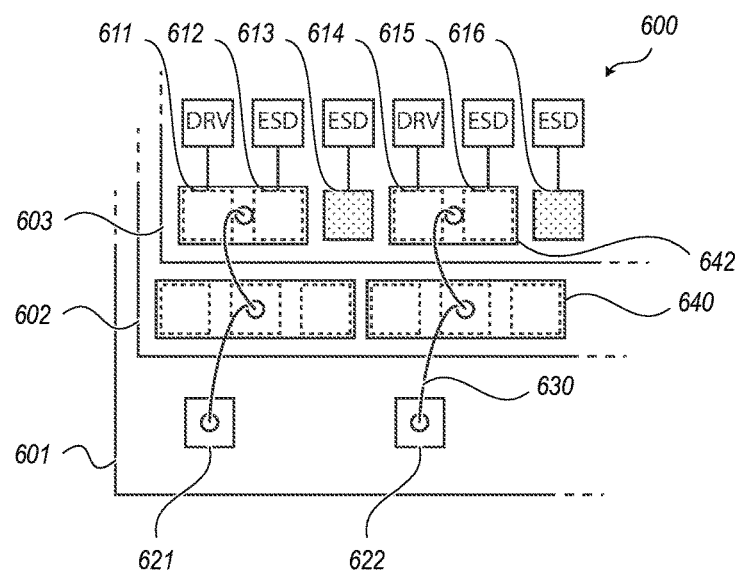
FIGS. 6-9 are simplified schematic views of semiconductor device assemblies in accordance with embodiments of the present technology.

This can be better understood with reference to FIG. 6, which is a simplified schematic view of a semiconductor device assembly 600 in accordance with an embodiment of the present technology. Assembly 600 includes a substrate 601 and two semiconductor dies 602 and 603 (e.g., identical semiconductor dies). Like the semiconductor device 500 illustrated in FIG. 5 above, each semiconductor die 602 and 603 includes multiple contact pads, such as first through sixth contact pads 611-616, each providing connectivity to either a circuit with active components (e.g., a driver circuit) or a circuit with passive components (e.g., an ESD protection circuit). Because each ESD protection circuit is provided with a dedicated contact pad, the assembly 600 can be configured with a desired amount of ESD protection for each driver circuit.

As can be seen with reference to FIG. 6, the substrate 601 includes two substrate contacts 621 and 622. The first substrate contact 621 is connected (e.g., by a wirebond 630) to a first plated pad 640 that connects at least a part of the first contact pad 611 (corresponding to a driver circuit) to at least a part of the second contact pad 612 (corresponding to an ESD protection circuit) and at least a part of the third contact pad 613 (corresponding to another ESD protection circuit) of the lower semiconductor die 602. The first plated pad 640 is further connected by another wirebond to a second plated pad 642 of the upper semiconductor die 603, which connects at least a part of the first contact pad 611 and the second contact pad 612 (but not the third contact pad 613) thereof. In this manner, the first substrate contact 621 is electrically coupled to the first, second and third contact pads 611-613 of the lower semiconductor die 602 and to just the first and second contact pads 611 and 612 of the upper semiconductor die. Similarly, the second substrate contact 622 is connected to the fourth contact pad 614 (corresponding to a driver circuit) of each semiconductor die 602 and 603 in the assembly 600, and is connected to the fifth contact pad 615 (corresponding to an ESD protection circuit) of each semiconductor die 602 and 603 in the assembly 600, but is connected to the sixth contact pad 616 (corresponding to another ESD protection circuit) of only one semiconductor die 602 in the assembly 600. By leaving electrically disconnected from the substrate contacts 621 and 622 the third and sixth contact pads 613 and 616 (corresponding to ESD protection circuits) on the upper semiconductor die 603, the capacitance of the circuit to which each substrate contact 621 and 622 is connected is less than it would be if ESD protection circuits from each die in the assembly 600 were connected.

Figure 7:
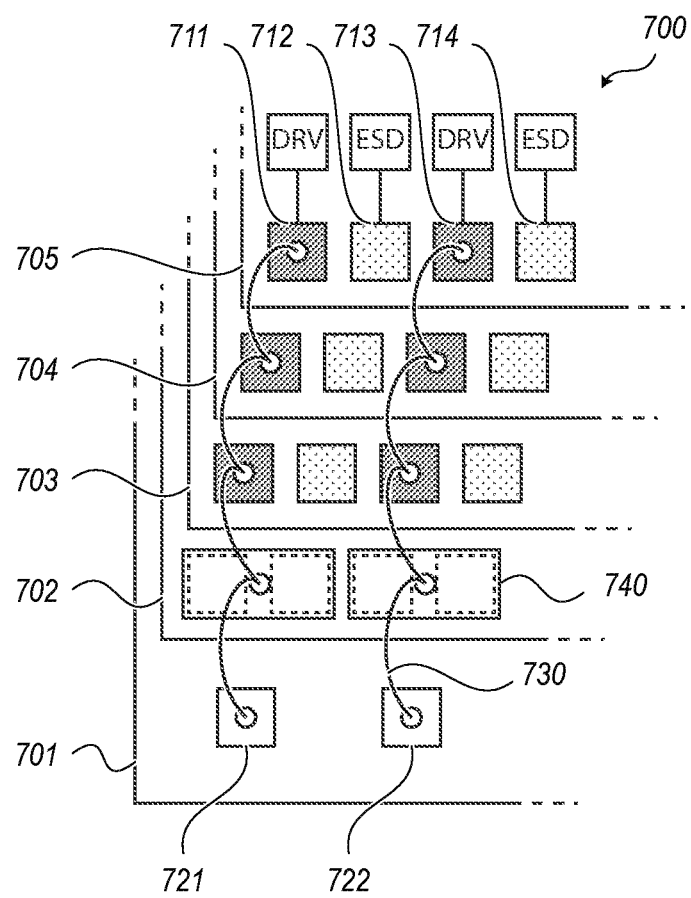

Although in the foregoing embodiments semiconductor device assemblies have been illustrated and described with two semiconductor dies, in other embodiments of the present technology semiconductor device assemblies can include different numbers of dies. For example, FIG. 7 is a simplified schematic view of a semiconductor device assembly 700 including four semiconductor dies in accordance with an embodiment of the present technology. Assembly 700 includes a substrate 701 and four semiconductor dies 702-705 (e.g., identical semiconductor dies). Like the semiconductor device 300 illustrated in FIG. 3 above, each semiconductor die 702-705 includes multiple contact pads, such as first through fourth contact pads 711-714, each providing connectivity to either a circuit with active components (e.g., a driver circuit) or a circuit with passive components (e.g., an ESD protection circuit). Because each ESD protection circuit is provided with a dedicated contact pad, the assembly 700 can be configured with a desired amount of ESD protection for each driver circuit.

As can be seen with reference to FIG. 7, the substrate 701 includes two substrate contacts 721 and 722. The first substrate contact 721 is connected (e.g., by a wirebond 730) to a plated pad 770 that connects at least a part of the first contact pad 711 (corresponding to a driver circuit) to at least a part of the second contact pad 712 (corresponding to an ESD protection circuit) of a first semiconductor die 702. The plated pad 740 is further connected by additional wirebonds to only the first contact pad 711 of the other three dies 703-705 in the assembly 700. In this manner, the first substrate contact 721 is electrically coupled to both the first and second contact pads 711 and 712 of the first semiconductor die 702 and to just the first contact pad 711 of the other semiconductor dies 703-705 in the assembly 700. Similarly, the second substrate contact 722 is connected (e.g., by a wirebond 730) to the third contact pad 713 (corresponding to a driver circuit) of each semiconductor die 702-705 in the assembly 700, but is connected to the fourth contact pad 714 (corresponding to an ESD protection circuit) of three of the semiconductor dies 703-705 in the assembly 700. By leaving electrically disconnected from the substrate contacts 721 and 722 the second and fourth contact pads 712 and 714 (corresponding to ESD protection circuits) on three of the semiconductor dies 703-705, the capacitance of the circuit to which each substrate contact 721 and 722 is connected is less than it would be if ESD protection circuits from each die in the assembly 700 were connected.

Figure 8:
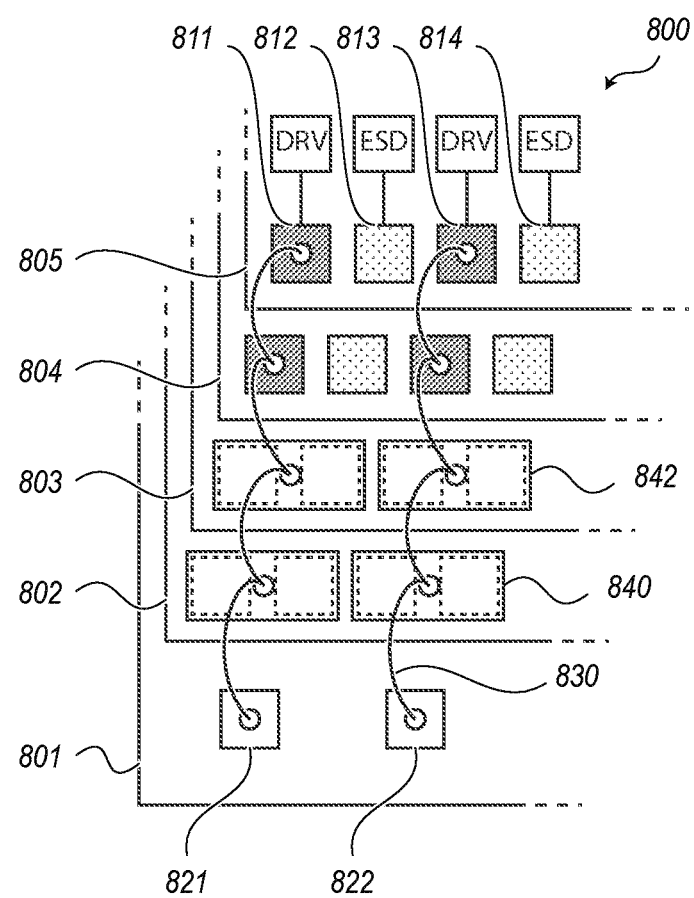

Although in the embodiment illustrated in FIG. 7 the ESD protection circuits of only one die in the assembly are connected to the substrate contacts, in other embodiments a semiconductor device assembly can include multiple dies that have ESD protection circuits connected to the substrate contact(s) thereof. For example, FIG. 8 is a simplified schematic view of a semiconductor device assembly 800 in accordance with an embodiment of the present technology. Assembly 800 includes a substrate 801 and four semiconductor dies 802-805 (e.g., identical semiconductor dies), each including multiple contact pads, such as first through fourth contact pads 811-814, for providing connectivity to either a circuit with active components (e.g., a driver circuit) or a circuit with passive components (e.g., an ESD protection circuit).

As can be seen with reference to FIG. 8, the substrate 801 includes two substrate contacts 821 and 822. The first substrate contact 821 is connected (e.g., by wirebonds 830) to the first contact pad 811 (corresponding to a driver circuit) of each semiconductor die 802-805 in the assembly 800, but is connected (e.g., by plated pads 840 and 842) to the second contact pad 812 (corresponding to an ESD protection circuit) of only two of the semiconductor dies 802 and 803 in the assembly 800. Similarly, the second substrate contact 822 is connected (e.g., by wirebonds 830) to the third contact pad 813 (corresponding to a driver circuit) of each semiconductor die 802-805 in the assembly 800, but is connected (e.g., by plated pads 840 and 842) to the fourth contact pad 814 (corresponding to an ESD protection circuit) of only two of the semiconductor dies 802 and 803 in the assembly 800. By leaving electrically disconnected from the substrate contacts 821 and 822 the second and fourth contact pads 812 and 814 (corresponding to ESD protection circuits) on two of the semiconductor dies 804 and 805, the capacitance of the circuit to which each substrate contact 821 and 822 is connected is less than it would be if ESD protection circuits from each die in the assembly 800 were connected.

Figure 9:
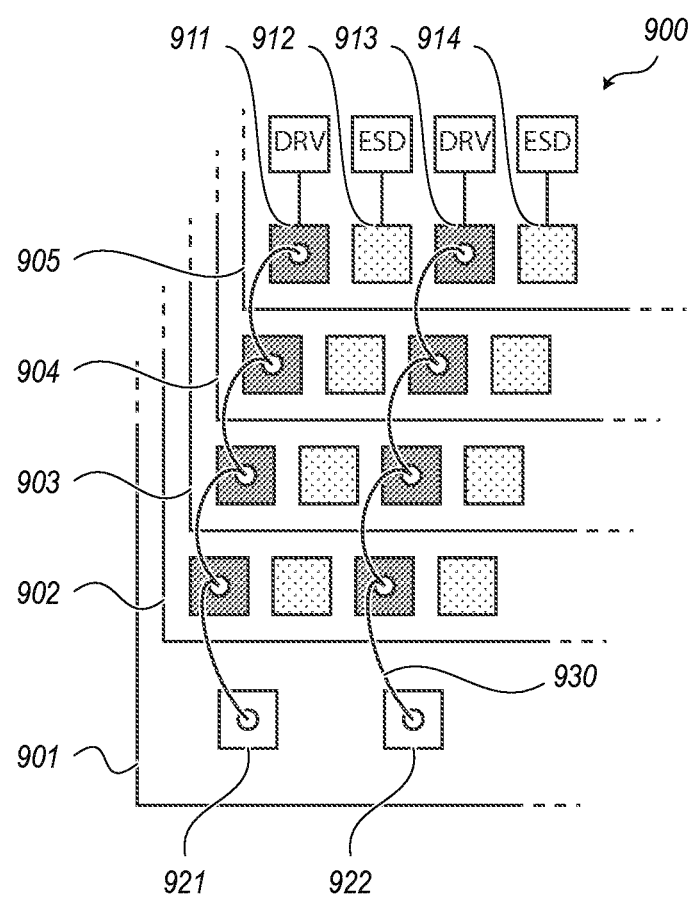

Although in the foregoing embodiments semiconductor device assemblies have been illustrated in which at least one die includes attached ESD protection circuits, in other embodiments of the present technology semiconductor device assemblies can include multiple dies, all of which include ESD protection circuits that are not connected (e.g., reliant on the inherent capacitance of the multiple driver circuits, such that there is no need for additional capacitance). For example, FIG. 9 is a simplified schematic view of a semiconductor device assembly 900 in accordance with an embodiment of the present technology. Assembly 900 includes a substrate 901 and four semiconductor dies 902-905 (e.g., identical semiconductor dies), each including multiple contact pads, such as first through fourth contact pads 911-914, for providing connectivity to either a circuit with active components (e.g., a driver circuit) or a circuit with passive components (e.g., an ESD protection circuit).

As can be seen with reference to FIG. 9, the substrate 901 includes two substrate contacts 921 and 922. The first substrate contact 921 is connected (e.g., by wirebonds 930) to the first contact pad 911 (corresponding to a driver circuit) of each semiconductor die 902-905 in the assembly 900, but is connected (e.g., due to the absence of plated pads) to none of the second contact pads 912 (corresponding to an ESD protection circuit) of any of the semiconductor dies 902-905 in the assembly 900. Similarly, the second substrate contact 922 is connected (e.g., by wirebonds 930) to the third contact pad 913 (corresponding to a driver circuit) of each semiconductor die 902-905 in the assembly 900, but is connected (e.g., due to the absence of plated pads) to none of the fourth contact pads 914 (corresponding to an ESD protection circuit) of any of the semiconductor dies 902-905 in the assembly 900. By leaving electrically disconnected from the substrate contacts 921 and 922 the second and fourth contact pads 912 and 914 (corresponding to ESD protection circuits) on all of the semiconductor dies 902-905, the capacitance of the circuit to which each substrate contact 921 and 922 is connected is less than it would be if ESD protection circuits from any of the dies in the assembly 900 were connected.

Although in the foregoing example embodiments, semiconductor dies are described as including multiple discrete contact pads that can be optionally connected to increase the capacitance of a driver circuit, the present technology has application to other circuit designs as well. In this regard, other embodiments of the present technology can provide semiconductor dies with multiple contact pads for optionally connecting any number of different circuits, with any desired function in addition to or in lieu of ESD protection circuits and driver circuits.

Figure 10:
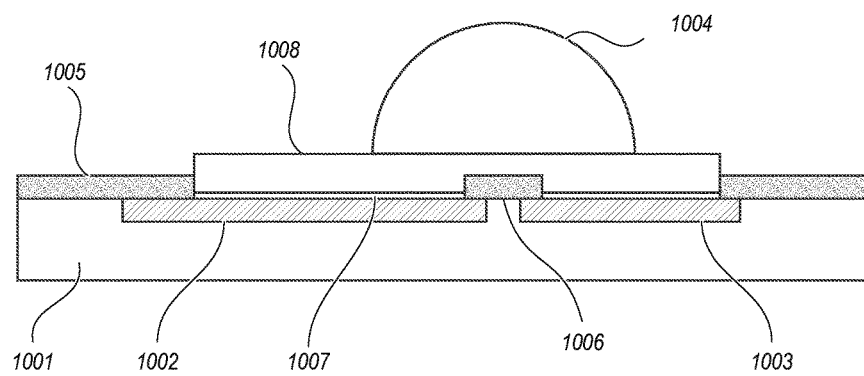
FIGS. 10 and 11 are simplified partial cross-sectional views of semiconductor devices in accordance with embodiments of the present technology.

In accordance with various embodiments of the present technology, plated pads can be formed to connect discrete contact pads on a semiconductor die in a variety of ways. For example, FIG. 10 illustrates a simplified partial cross-sectional view of a semiconductor device in accordance with an embodiment of the present technology. In the semiconductor device 1001 illustrated in FIG. 10, contact pads 1002 and 1003 (e.g., connected to discrete circuits in the semiconductor device such as a driver circuit and an ESD protection circuit) are provided under a layer of passivation or polymide material 1005, and therefore separated by a small region 1006 of the passivation or polymide material. To form a plated pad 1008 that electrically connects at least a portion of each of these contact pads 1002 and 1003, a seed layer 1007 can be formed on each contact pad (e.g., a Ti material or the like), and a plating operation can be performed to plate a material (e.g., Cu, Al or the like) over the seed layer 1007 on each contact pad 1002 and 1003 to a height greater than that of the small region 1006 of the passivation or polymide material. A single solder ball 1004 can then be used to connect both of the contact pads 1002 and 1003 (e.g., by way of plated pad 1008) to another semiconductor device or substrate (e.g., with a wirebond).

Figure 11:
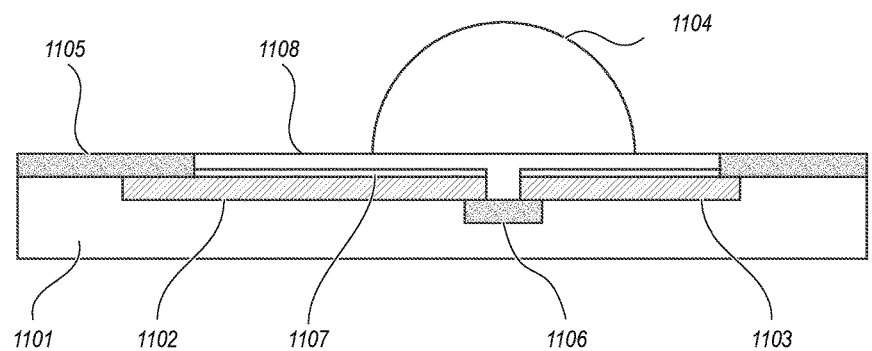

By way of further example, FIG. 11 illustrates a simplified partial cross-sectional view of another semiconductor device in accordance with an embodiment of the present technology. In the semiconductor device 1101 illustrated in FIG. 11, contact pads 1102 and 1103 are provided under a layer of passivation or polymide material 1105, but additional process steps (e.g., masking and etching) have been undertaken to eliminate the passivation or polymide material 1105 from between the contact pads 1102 and 1103 (e.g., by including an etch stop material 1106 under the region between the contact pads 1102 and 1103, to permit etching away the passivation or polymide material 1105 from between them). This arrangement facilitates fabricating a single plated pad 1108 (e.g., over a seed layer 1107 on each contact pad 1102 and 1103) with a top surface generally co-planar with, or lower than, a top surface of the passivation or polymide material 1105 (e.g., thereby not contributing to an increased packaged height of semiconductor device 1100). A single solder ball 1104 can then be used to connect both of the contact pads 1102 and 1103 (e.g., by way of plated pad 1108) to another semiconductor device or substrate (e.g., with a wirebond).

Although in the foregoing examples semiconductor device assemblies have been described as including a single stack of semiconductor dies, in other embodiments of the present technology, a semiconductor device assembly can include multiple stacks of semiconductor dies in which passive circuits can optionally be connected via dedicated contact pads. For example, in one embodiment of the present technology, a semiconductor device assembly can include multiple laterally-separated stacks of semiconductor dies (e.g., two stacks of four dies each, two stacks of eight dies each, four stacks of four dies each, etc.) in which less than all of the available ESD circuits in each stack are electrically coupled to an active circuit. In another embodiment, a semiconductor device assembly can include a single stack of semiconductor dies in which subsets of the dies in the stack are separately connected to the substrate (e.g., a shingled stack with eight dies grouped as a first subset electrically coupled to the substrate, with less than all of the available dies in the first subset having electrically coupled ESD circuits, and another eight dies above the first eight dies, with a shingle offset direction opposite that of the first subset, grouped as a second subset electrically coupled to the substrate separately from the first subset, with less than all of the available dies in the second subset having electrically coupled ESD circuits, etc.).

Figure 12:
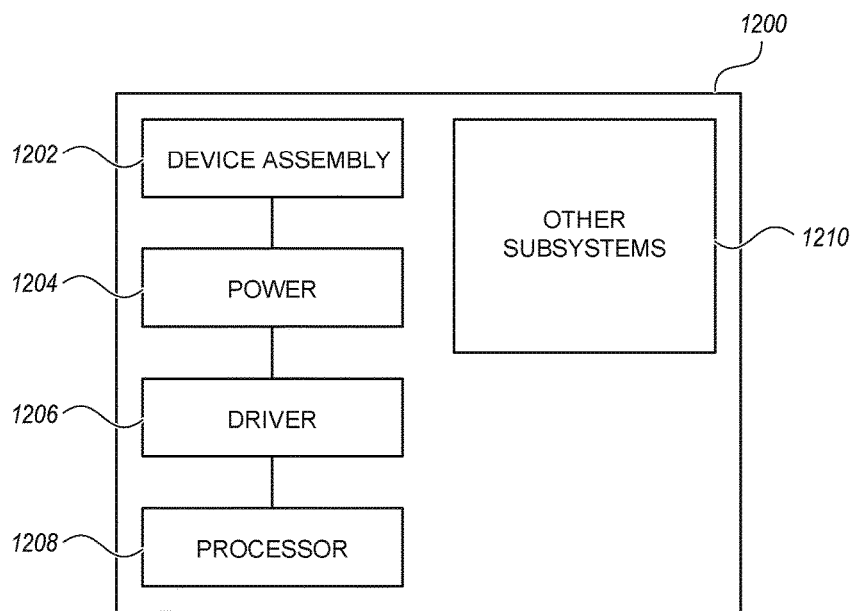
FIG. 12 is a schematic view showing a system that includes a semiconductor device assembly configured in accordance with an embodiment of the present technology.

Any one of the semiconductor device assemblies described above with reference to FIGS. 3-11 can be incorporated into any of a myriad of larger and/or more complex systems, a representative example of which is system 1200 shown schematically in FIG. 12. The system 1200 can include a semiconductor device assembly 1202, a power source 1204, a driver 1206, a processor 1208, and/or other subsystems or components 1210. The semiconductor device assembly 1202 can include features generally similar to those of the semiconductor devices described above with reference to FIGS. 3-11. The resulting system 1200 can perform any of a wide variety of functions, such as memory storage, data processing, and/or other suitable functions. Accordingly, representative systems 1200 can include, without limitation, hand-held devices (e.g., mobile phones, tablets, digital readers, and digital audio players), computers, vehicles, appliances and other products. Components of the system 1200 may be housed in a single unit or distributed over multiple, interconnected units (e.g., through a communications network). The components of the system 1200 can also include remote devices and any of a wide variety of computer readable media.

Figure 13:
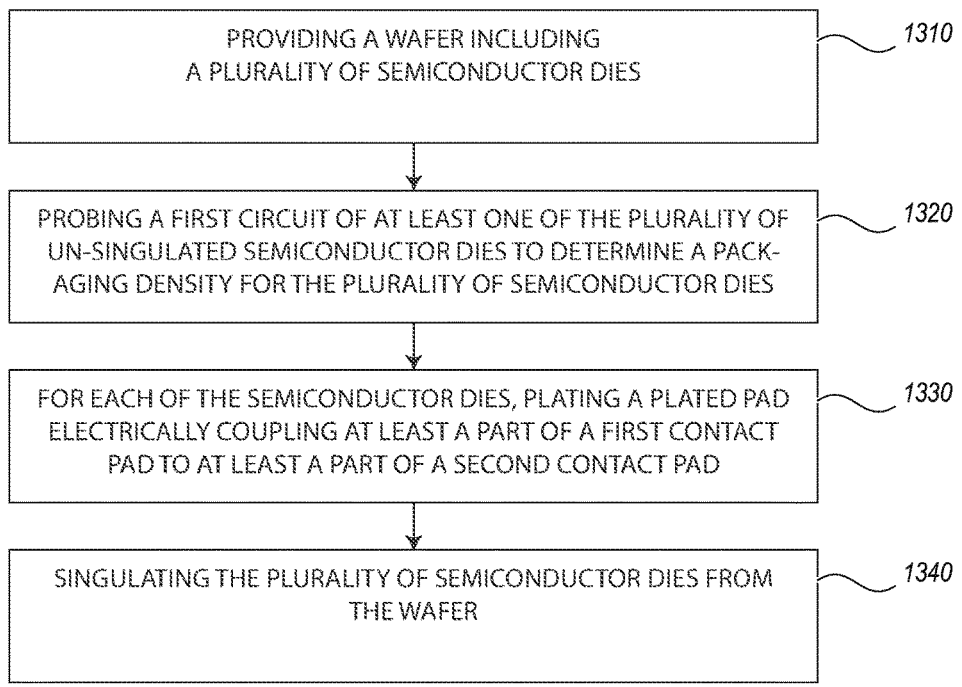
FIG. 13 is a flow chart illustrating a method of making a semiconductor device in accordance with an embodiment of the present technology.

FIG. 13 is a flow chart illustrating a method of making a semiconductor device. The method includes providing a wafer including a plurality of semiconductor dies (box 1310). Each of the plurality of semiconductor dies includes a first contact pad electrically coupled to a first circuit on the semiconductor die including at least one active circuit element, and a second contact pad electrically coupled to a second circuit on the semiconductor die including only passive circuit elements. The method can further include probing the first circuit of at least one of the plurality of un-singulated semiconductor dies to determine a packaging density for the plurality of semiconductor dies (box 1320). The method can further include plating, for each of the plurality of semiconductor dies, a plated pad electrically coupling at least a part of the first contact pad to at least a part of the second contact pad (box 1330). The plating can be based at least in part on the determined packaging density. The method can further include singulating the plurality of semiconductor dies from the wafer (box 1340). Before singulation, the method can further include thinning the wafer based at least in part on the determined packaging density (e.g., wherein dies binned for higher packaging densities can be thinned more than dies binned for lower packaging densities).

From the foregoing, it will be appreciated that specific embodiments of the invention have been described herein for purposes of illustration, but that various modifications may be made without deviating from the scope of the invention. Accordingly, the invention is not limited except as by the appended claims.

We claim:
1. A semiconductor device assembly, comprising:
 a substrate;
 a die coupled to the substrate, the die including:
  a first contact pad electrically coupled to a first circuit on the die including at least one active circuit element,
  a second contact pad electrically coupled to a second circuit on the die including only passive circuit elements, and
  a plated pad electrically coupling at least a part of the first contact pad to at least a part of the second contact pad;
 wherein the substrate includes a substrate contact electrically coupled to the plated pad on the die, and
 wherein the die further includes a fifth contact pad electrically coupled to a fifth circuit on the die including only passive circuit elements, and wherein the plated pad further electrically couples at least the part of the first contact pad and at least the part of the second contact pad to at least a part of the fifth contact pad, such that the substrate contact is electrically coupled to the fifth contact pad.

2. The semiconductor device assembly of claim 1, wherein the die is a first die, further comprising:
a second die including:
a third contact pad electrically coupled to a third circuit on the second die including at least a second active circuit element, and
a fourth contact pad electrically coupled to a fourth circuit on the second die including only passive circuit elements;
wherein the substrate contact is electrically coupled to the third contact pad on the second die.

3. The semiconductor device assembly of claim 2, wherein the fourth contact pad on the second die is electrically disconnected from the substrate contact.

4. The semiconductor device assembly of claim 2, wherein the second die further includes another plated pad electrically coupling at least a part of the third contact pad to at least a part of the fourth contact pad.

5. The semiconductor device assembly of claim 4, wherein the first and second dies are identical dies, wherein the first contact pad on the first die corresponds to the third contact pad on the second die, and the second contact pad on the first die corresponds to the fourth contact pad on the second die.

6. The semiconductor device assembly of claim 2, wherein the first and second dies are stacked in a shingled configuration.

7. The semiconductor device assembly of claim 1, wherein the first circuit is a driver circuit.

8. The semiconductor device assembly of claim 1, wherein the second circuit includes one or more capacitors to provide electrostatic discharge (ESD) protection.

9. The semiconductor device assembly of claim 1, wherein the substrate contact is electrically coupled to the plated pad by a wirebond.

10. The semiconductor device assembly of claim 1, wherein the die is a NAND memory die.

* * * * *